United States Patent
Lee

(10) Patent No.: US 6,846,722 B2
(45) Date of Patent: Jan. 25, 2005

(54) METHOD FOR ISOLATING A HYBRID DEVICE IN AN IMAGE SENSOR

(75) Inventor: Won-Ho Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/616,155

(22) Filed: Jul. 9, 2003

(65) Prior Publication Data

US 2004/0033667 A1 Feb. 19, 2004

(30) Foreign Application Priority Data

Jul. 19, 2002 (KR) ................................ 10-2002-0042650

(51) Int. Cl.⁷ .......................... H01L 21/76; H01L 21/00; H01L 21/8234
(52) U.S. Cl. .......................... 438/449; 438/22; 438/200; 438/237; 438/451
(58) Field of Search ................................ 438/447–451, 438/298, 462, 22, 200, 237; 257/519, 648, 652

(56) References Cited

U.S. PATENT DOCUMENTS

| | | | | |
|---|---|---|---|---|
| 5,128,274 | A | * | 7/1992 | Yabu et al. .................. 438/452 |
| 6,281,533 | B1 | * | 8/2001 | Miyagawa et al. .......... 257/290 |
| 6,351,002 | B1 | * | 2/2002 | Pan ............................. 257/233 |
| 6,417,023 | B2 | * | 7/2002 | Suzuki et al. ................. 438/73 |
| 6,528,342 | B2 | * | 3/2003 | Miyagawa et al. ............ 438/79 |
| 2001/0017382 | A1 | * | 8/2001 | Rhodes et al. ............... 257/233 |
| 2002/0117699 | A1 | * | 8/2002 | Francois ...................... 257/291 |

FOREIGN PATENT DOCUMENTS

| | | | | | |
|---|---|---|---|---|---|
| JP | 05075043 | A | * | 3/1993 | ......... H01L/27/092 |
| JP | 05-283404 | A | | 10/1993 | |
| JP | 05283404 | A | * | 10/1993 | ......... H01L/21/316 |

OTHER PUBLICATIONS

Fujieda et al., "Dependence of Si PN Junction Perimeter Leakage on the Channel–Stop Boron Dose and Interlayer Material" (IEEE Electron Device Letters, vol. 20, No. 8, Aug. 1999, pp. 418–420).

Morris et al., "An Accurate and Efficient Model for Boron Implants Through Thin Oxide Layers into Single–Crystal Silicon" (IEEE Transactions on Semiconductor Manufacturing, vol. 8, No. 4, Nov. 1995, pp. 408–413).

Walter et al., "Dopant Channeling as a Function of Implant Angle for Low Energy Applications" (IEEE, 1999, pp. 126–129).

Son et al., "Blanket Tilt Implanted Shallow Trench Isolation (BTI–STI) Process for Enhanced DRAM Retention Time Characteristics" (IEEE, 1999, pp. 122–124).

* cited by examiner

Primary Examiner—Shouxiang Hu
(74) Attorney, Agent, or Firm—Marshall, Gerstein & Borun LLP

(57) ABSTRACT

The present disclosure relates to a method for fabricating an image sensor capable of improving dark current characteristics. The method includes: forming sequentially a pad oxide layer and a pad nitride layer on a substrate and selectively removing a portion of the pad oxide layer and a first portion of the pad nitride layer to expose a surface of the substrate on which a field insulation layer will be formed; forming a first ion-implantation region by performing a first ion-implantation process on the exposed surface of the substrate using the remaining pad nitride layer that exists after removal of the first portion of the pad nitride layer as a first mask; performing a thermal oxidation process to form the field insulation layer on the exposed surface of the substrate; removing a second portion of the pad nitride layer so that a side of the remaining pad nitride layer that exists after removal of the second portion of the pad nitride layer is spaced apart from an edge of the field insulation layer by a distance; and forming a second ion-implantation region by performing a second ion-implantation process on the field insulation layer using the remaining pad nitride layer that exists after removal of the second portion of the pad nitride layer as a second mask.

4 Claims, 5 Drawing Sheets

METHOD FOR ISOLATING A HYBRID DEVICE IN AN IMAGE SENSOR

TECHNICAL FIELD

The present disclosure relates to an image sensor and, more particularly, to an image sensor capable of reducing the generation of dark current by using a hybrid device isolation process.

DESCRIPTION OF RELATED ARTS

Generally, an image sensor is a semiconductor device that changes an optical image into electrical signals. A charge-coupled device (CCD) is a device in which capacitors are located close to each other. Electric charge carriers are stored at the capacitors and transmitted through the capacitors. A complementary metal-oxide semiconductor (CMOS) image sensor is a device constructed from as many MOS transistors as the number of pixels. The CMOS image sensor uses a switching scheme to detect image outputs sequentially using the MOS transistors by employing CMOS technology, and using a control circuit and a signal processing circuit as periphery circuits.

There are several problems associated with using a CCD due to its complex driving mode, high power dissipation, complex fabrication process having several steps for the mask processes, and its difficulty in being realized on one chip since signal processing circuitry cannot be constructed directly on the CCD chip. Therefore, there has been active research related to a CMOS image sensor that uses submicron CMOS technology to overcome the problems noted above. A CMOS image sensor obtains an image by forming a photodiode and a MOS transistor within a unit pixel and then uses a switching mode to sequentially detect signals. The use of CMOS technology results in less power dissipation and enables the signal processing circuitry to be located on one chip. Also, compared to the CCD process, which requires approximately 30 to 40 masks, a CMOS image sensor implemented with CMOS technology is a simplified process that needs approximately 20 masks. Therefore, the CMOS image sensor is currently highlighted as a next generation image sensor.

In a typical image sensor, dark current is produced more easily, resulting in a decrease in function and capability of the image sensor to store charges. A more detailed explanation of dark current will be provided below.

Electrons that move to a floating diffusion region from a photodiode may produce dark current even in the absence of light. Particularly, dark current is caused by a dangling bond or various defects, such as a line defect, a point defect and so forth, that mainly exist in the edges of an activation region. Such dark current may cause severe problems in a low-illumination environment.

In a CMOS image sensor having a device line-width of about 0.35 µm or about 0.25 µm, as the area of the photodiode decreases, a ratio of the perimeter of the photodiode with respect to the area of the photodiode decreases as well.

Referring to FIG. 1, since three surfaces of the photodiode, except for the surface in which a transfer transistor will be formed, are in contact with the field insulation layer, the photodiode is affected by same defects generated at the edges of the field insulation layer as the photodiode area decreases due to micronization. The perimeter of the photodiode is calculated using only the three surfaces in contact with the field insulation layer.

This effect of increasing dark current generation with respect to an image signal is pronounced as the minimum device line-width, e.g., about 0.25 µm or 0.18 µm. decreases. In other words, a CMOS image sensor with an ultra fine line-width more easily causes dark current.

SUMMARY

A method for isolating a hybrid device in an image sensor by improving dark current characteristics even if the area of the photodiode region is reduced is disclosed.

In accordance with an aspect of the present disclosure, a method for isolating a hybrid device in an image sensor includes: forming sequentially a pad oxide layer and a pad nitride layer on a substrate and selectively removing a portion of the pad oxide layer and a first portion of the pad nitride layer to expose a surface of the substrate on which a field insulation layer will be formed; forming a first ion-implantation region by performing a first ion-implantation process on the exposed surface of the substrate using the remaining pad nitride layer that exists after removal of the first portion of the pad nitride layer as a first mask; performing a thermal oxidation process to form the field insulation layer on the exposed surface of the substrate; removing a second portion of the pad nitride layer so that a side of the remaining pad nitride layer that exists after removal of the second portion of the pad nitride layer is spaced apart from an edge of the field insulation layer by a distance; and forming a second ion-implantation region by performing a second ion-implantation process on the field insulation layer using the remaining pad nitride layer that exists after removal of the second portion of the pad nitride layer as a second mask.

BRIEF DESCRIPTION OF THE DRAWING(S)

The above will become apparent from the following description of embodiments taken in conjunction with the accompanying drawings, in which.

DETAILED DESCRIPTION

Figure 1:
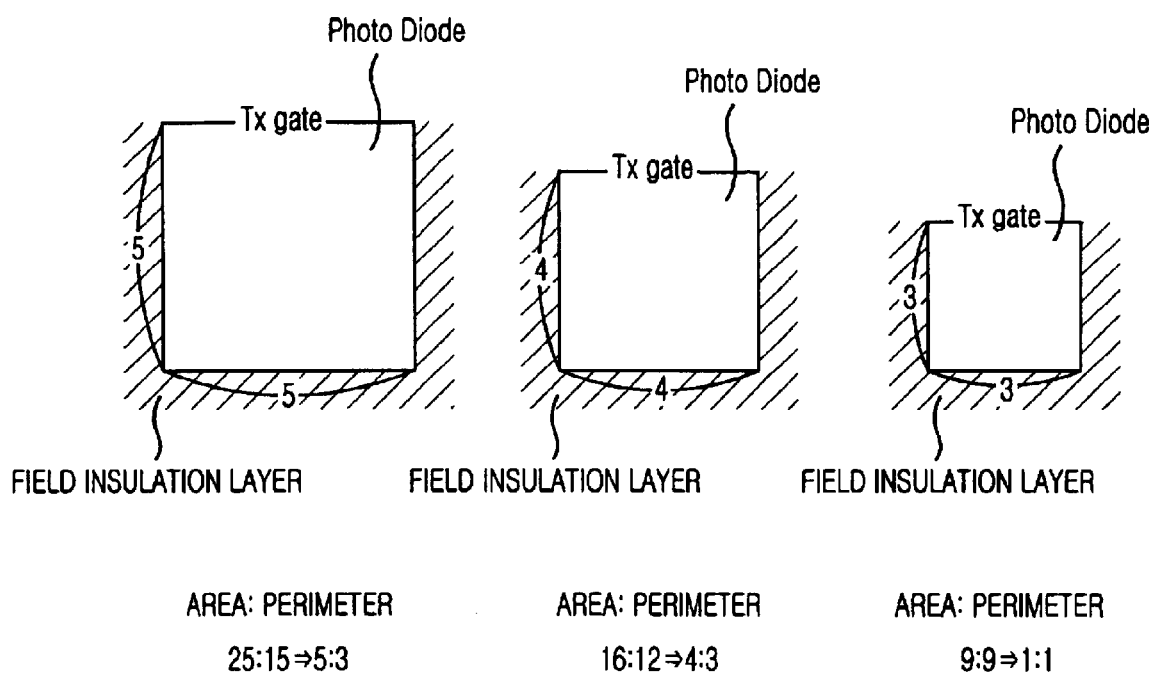
FIG. 1 is an exemplary diagram showing a ratio of a photodiode perimeter with respect to a photodiode area in a typical image sensor.
Figure 2A:
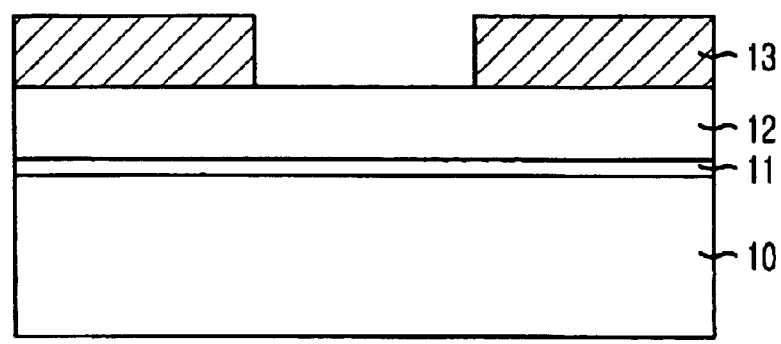
FIGS. 2A to 2D are cross-sectional views showing a hybrid device isolation region in an image sensor in accordance with one embodiment.

Referring to FIG. 2A, a pad oxide layer 11, a pad nitride layer 12 and a photosensitive layer 13, which will be used as a device isolation mask in subsequent processes, are sequentially formed on a substrate 10. Then, a device isolation mask process is performed on a region of the substrate 10 where a field insulation layer will be formed. The substrate 10 can use a stack structure in which an epitaxial layer with a low concentration is deposited on a silicon layer with a high concentration.

The lowly concentrated epitaxial layer is used because it is possible to improve device properties by increasing the depth of the depletion layer of the photodiode, as well as to prevent cross talk between unit pixels in a substrate with a high concentration.

Figure 2B:
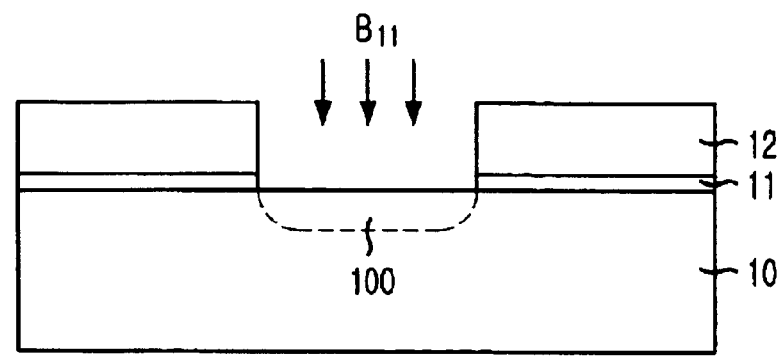

Referring to FIG. 2B, the pad nitride layer 12 and the pad oxide layer 11 are etched using the device isolation mask 13 to expose a surface of the substrate 10 on which the field insulation layer will be formed. The device isolation mask 13 is removed after the pad nitride layer 12 and the pad oxide layer 11 have been etched.

Next, a channel stop ion-implantation process is performed to the surface of the substrate 10 by using the etched pad nitride layer 12 as an ion-implantation mask to form a channel stop ion-implantation region 100. For the channel stop ion-implantation process, the ion-implantation concentration of boron is about $3.0 \times 10^{13}$ cm$^{-3}$ and the ion-implantation energy is about 30 keV. The above channel stop ion-implantation process is carried out without specifying a tilt angle and a rotation angle.

Figure 2C:
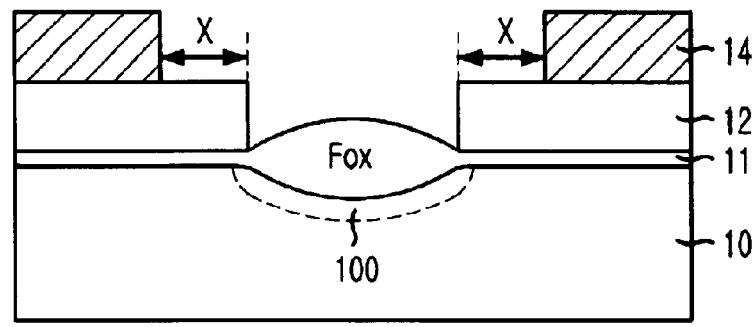

With reference to FIG. 2C, after the channel stop ion-implantation process is completed, a thermal oxidation process is performed to form the field insulation layer, e.g., a field oxide layer (Fox) on the surface of the exposed substrate 10. A photosensitive pattern 14 is subsequently formed on the pad nitride layer 12 to etch the pad nitride layer 12 so that a side of the pad nitride layer 12 is spaced apart from an edge of the Fox by a predetermined distance X. The predetermined distance X ranges from about 0.5 µm to about 1.0 µm.

Figure 2D:
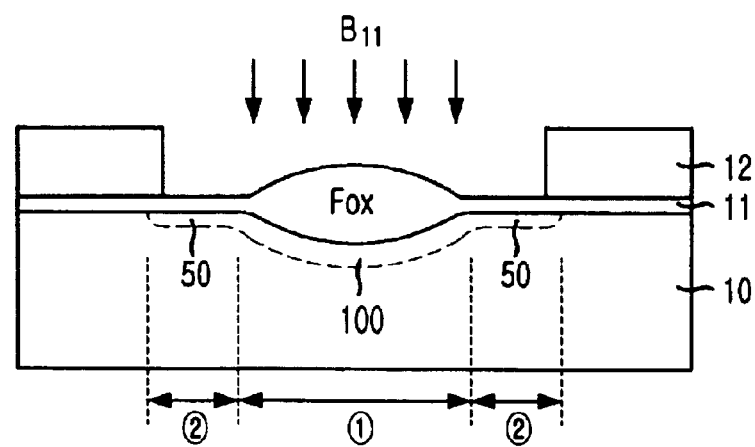

With reference to FIG. 2D, the pad nitride layer 12 is etched so that a side of the pad nitride layer 12 is spaced apart from the edge of the Fox by the predetermined distance X by using the photosensitive pattern 14 as an etch mask. Subsequently, a boron ion-implantation process is performed on the Fox by using the etched pad nitride layer 12 as an ion-implantation mask.

The boron ion-implantation process can be carried out under the same conditions as the channel stop ion-implantation process. Alternatively, the boron ion-implantation process can be carried out using a boron concentration ranging from about $4.0 \times 10^{13}$ cm$^{-3}$ to about $5.0 \times 10^{13}$ cm$^{-3}$. Such an optimal dosing concentration is determined after receiving feedback information about dark current characteristics.

Referring to FIG. 2D, the numerical symbol "1" enclosed in a circle represents the channel stop ion-implantation region 100 formed by the channel stop ion-implantation process, and the numerical symbol "2" enclosed in a circle represents a boron ion-implantation region 50 formed by the boron ion-implantation process. The photosensitive pattern 14 is removed after the boron ion-implantation process is performed.

In accordance with one embodiment, the boron ion-implantation region 50 encompasses the edges of the Fox, thereby improving dark current characteristics. In other words, electrons generated at the edges of the Fox disappear by electron-hole pair recombination, which occurs at the boron ion-implantation region 50.

Figure 3:
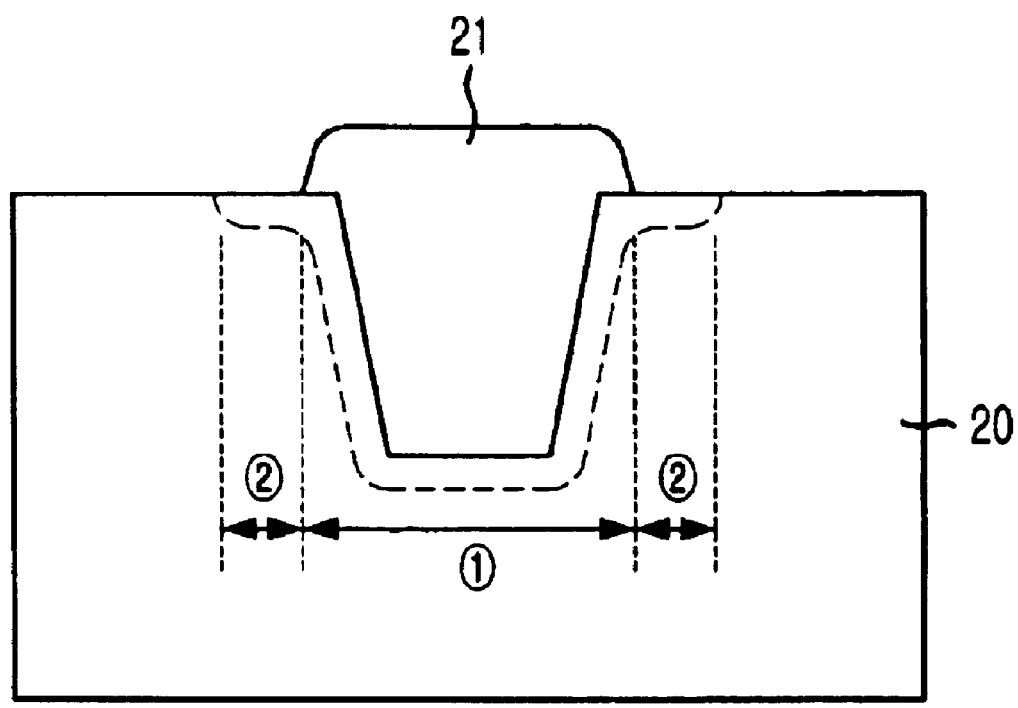
FIG. 3 is a cross-sectional view showing a device isolation region having a trench structure in accordance with another embodiment.

FIG. 3 is a cross-sectional view showing a device isolation region having a trench structure in accordance with another embodiment. As with FIG. 2D, a channel stop ion-implantation region is represented by the numerical symbol "1" enclosed in a circle, and a boron ion-implantation region is represented by the numerical symbol "2" enclosed in a circle in FIG. 3.

Referring to FIG. 3, a process for forming a device isolation region having a trench structure is described. A buffer oxide layer (not shown) and a pad nitride layer (not shown) are sequentially deposited on a substrate 20. A device isolation mask is then used to selectively etch the buffer oxide layer and the pad nitride layer so that a region in which a trench will be formed is exposed. Afterwards, the trench is formed in the substrate 20 by an etch process using the pad nitride layer as an etch mask. After the trench formation, an oxide layer is formed in an inner wall of the trench to compensate for damage to the inner wall of the trench that occurred during the etch process.

Next, a channel stop ion-implantation process is performed to form the channel stop ion-implantation region, which is represented by the numerical symbol "1" enclosed in a circle in FIG. 3, and an insulation material 21 is deposited in the trench. The insulation material 21 in the trench is planarized by a chemical mechanical polishing (CMP) process, and a predetermined portion of the pad nitride layer is then etched so that one side of the pad nitride layer is spaced apart from an edge of the insulation material 21 by a predetermined distance.

After the etching process, a boron ion-implantation process is performed by using the pad nitride layer as an ion-implantation mask to form a boron ion-implantation region, which is represented by the numerical symbol "2" enclosed in a circle in FIG. 3. The pad nitride layer is removed thereafter, and a device isolation region having a shallow trench isolation structure is formed.

In addition to a typical device isolation process using a local oxidation of silicon (LOCOS) structure, the present disclosure can also be applied to a device isolation process using a trench structure or a poly buffered locos (PBL) process.

Figure 4A:
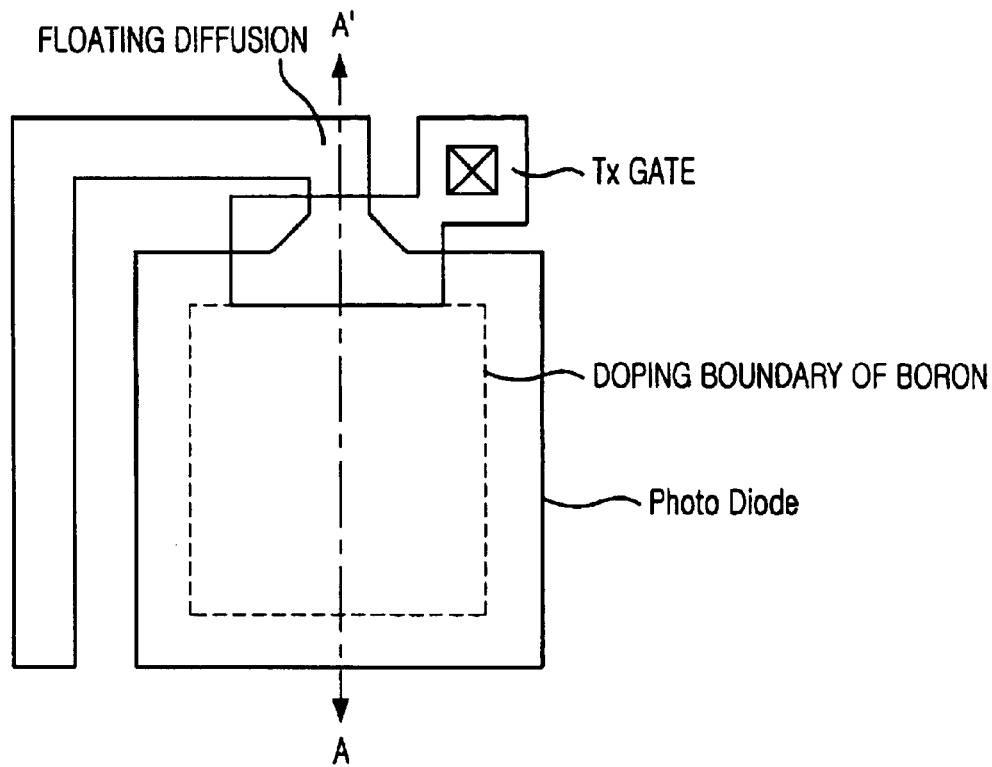
FIG. 4A is a plane view showing a layout of a photodiode and a transfer transistor in a unit pixel of a complementary metal-oxide semiconductor (CMOS) image sensor in accordance with yet another embodiment.

FIG. 4A is a plane view showing a layout of a photodiode and a transfer transistor in a unit pixel of a complementary metal-oxide semiconductor (CMOS) image sensor in accordance with another embodiment. A boron doping profile is spaced out a predetermined distance from a Fox (not shown). A boron ion-implantation region encompasses the edges of the Fox and, therefore, reduces dark current even if an n-type ion-implantation region of the photodiode is not reduced to a size to fit within the dotted boundary shown in FIG. 4A. It is also possible to prevent a reduction of saturation current since it is not necessarily required that the n-type ion-implantation region of the photodiode be reduced to improve dark current characteristics.

Figure 4B:
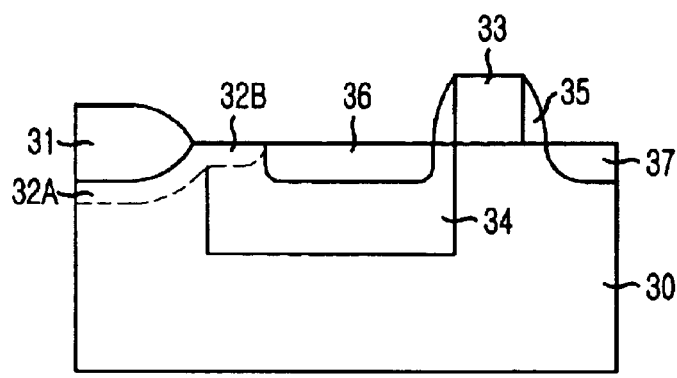
FIG. 4B is a cross-sectional view with respect to a line A–A' of FIG. 4A illustrating the photodiode and the transfer transistor in the unit pixel of the CMOS image sensor.

FIG. 4B is a cross-sectional view showing the photodiode region and the transfer transistor with respect to the line A–A' shown in FIG. 4A.

The structure illustrated in FIG. 4B includes a Fox layer 31 formed on a substrate 30, a channel stop ion-implantation region 32A formed on the bottom of the Fox layer 31, a boron ion-implantation region 32B extending a predetermined distance from an edge of the Fox layer 31, an n-type ion-implantation region 34 of the photodiode formed within the substrate 30 and in contact with one side of the Fox layer 31, a spacer 35 formed on lateral sides of a gate electrode 33 of the transfer transistor, a p-type ion-implantation region 36 for the photodiode formed in between the surface of the substrate 30 and the n-type ion-implantation region 34 for the photodiode, and a floating diffusion region 37 formed on the other side of the p-type ion-implantation region 36 for the photodiode and the transfer transistor. One side of the p-type ion-implantation region 36 for the photodiode is in contact with the spacer 35 and the other side of the p-type ion-implantation region 36 of the photodiode is in contact with the boron ion-implantation region 32B.

As illustrated in FIG. 4B, the boron ion-implantation region 32B extends a predetermined distance from an edge of the Fox layer 31 and encompasses the edge of the Fox layer 31. This encompassing action suppresses dark current generated at the edge of the Fox layer.

It is possible to improve dark current characteristics even in a micronized structure by using this hybrid device isolation technique. Also, it is not necessarily required that the photodiode be reduced to improve dark current characteristics. Therefore, it is possible to obtain a clearer and well-defined image since saturation currents can also be reduced.

While the present disclosure has been described with respect to certain embodiments, it will be apparent to those skilled in the art that various changes and modifications may be made without departing from the scope of the disclosure as defined in the following claims.

What is claimed is:

1. A method for isolating a hybrid device in an image sensor, the method comprising:

forming sequentially a pad oxide layer and a pad nitride layer on a substrate and selectively removing a portion of the pad oxide layer and a first portion of the pad nitride layer to expose a surface of the substrate on which a field-insulation layer will be formed;

forming a first ion-implantation region by performing a first ion-implantation process on the exposed surface of the substrate using the remaining pad nitride layer that exists after removal of the first portion of the pad nitride layer as a first mask;

performing a thermal oxidation process to form the field insulation layer on the exposed surface of the substrate;

removing a second portion of the pad nitride layer so that a side of the remaining pad nitride layer that exists after removal of the second portion of the pad nitride layer is spaced apart from an edge of the field insulation layer by a distance; and forming a second ion-implantation region by performing a second ion-implantation process on the field insulation layer using the remaining pad nitride layer that exists after removal of the second portion of the pad nitride layer as a second mask.

2. The method as recited in claim 1, wherein the distance ranges from about 0.5 $\mu$m to about 1.0 $\mu$m.

3. The method as recited in claim 1, wherein at least one of the first ion-implantation process and the second ion-implantation process is performed using boron.

4. The method as recited in claim 3, wherein the at least one of the first ion-implantation process and the second ion-implantation process using boron employs an ion-implantation energy of about 30 keV and dose amounts of boron in a range between about $4.0 \times 10^{13}$ cm$^{-3}$ to about $5.0 \times 10^{13}$ cm$^{-3}$.

* * * * *